(12) United States Patent
Wu et al.

(10) Patent No.: US 10,871,803 B2
(45) Date of Patent: Dec. 22, 2020

(54) FLEXIBLE STRUCTURES

(71) Applicant: HEWLETT-PACKARD DEVELOPMENT COMPANY, L.P., Houston, TX (US)

(72) Inventors: Kuan-Ting Wu, Taipei (TW); Wei Kuang Chu, Taipei (TW); Wei-Chung Chen, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/067,731

(22) PCT Filed: Apr. 29, 2016

(86) PCT No.: PCT/US2016/030102
§ 371 (c)(1),
(2) Date: Jul. 2, 2018

(87) PCT Pub. No.: WO2017/188988
PCT Pub. Date: Nov. 2, 2017

(65) Prior Publication Data
US 2019/0053391 A1 Feb. 14, 2019

(51) Int. Cl.
*G06F 1/16* (2006.01)
*E05D 1/00* (2006.01)
*H05K 5/02* (2006.01)

(52) U.S. Cl.
CPC .............. *G06F 1/1681* (2013.01); *E05D 1/00* (2013.01); *E05Y 2900/606* (2013.01); *G06F 1/1652* (2013.01); *H05K 5/0226* (2013.01)

(58) Field of Classification Search
CPC ....... E05D 1/00; E05D 1/04; E05D 2001/045; G06F 1/1652; G06F 1/1681; Y10T 16/5474; Y10T 16/5475; Y10T 16/525; Y10T 16/5253; Y10T 16/5257; H05K 5/0226
(Continued)

(56) References Cited

U.S. PATENT DOCUMENTS 1,043,092 A * 11/1912 Goodwin ............. G01B 3/1005
242/380
3,210,808 A * 10/1965 Creager ................ E04B 1/0046
52/204.705
(Continued)

FOREIGN PATENT DOCUMENTS

CN 103927940 7/2014
CN 107548478 1/2018
(Continued)

OTHER PUBLICATIONS

"The Tough New Yoga Hinge and What We Do With It", Oct. 9, 2014.

*Primary Examiner* — Jeffrey O'Brien
(74) *Attorney, Agent, or Firm* — HP Inc. Patent Department

(57) ABSTRACT

Examples described herein include a flexible structure for an electronic device that includes oblong connection elements flexibly coupled to one another in series. The series can have a first and a second end oblong connection element. The first end oblong connection element can be coupled to a first anchor element, while the second end oblong connection element can be coupled to a second anchor element.

14 Claims, 6 Drawing Sheets

(58) Field of Classification Search
USPC .................................................. 249/391.3
See application file for complete search history.

(56) References Cited

U.S. PATENT DOCUMENTS

| | | | | |
|---|---|---|---|---|
| 6,766,562 B1* | 7/2004 | Horn | .......................... | E05D 1/04 |
| | | | | 16/281 |
| 7,492,891 B2 | 2/2009 | Eldon | | |
| 7,532,916 B2 | 5/2009 | Lee et al. | | |
| 8,804,324 B2* | 8/2014 | Bohn | .................... | G06F 1/1616 |
| | | | | 345/1.1 |
| 8,855,726 B2 | 10/2014 | Ozawa | | |
| 9,176,535 B2* | 11/2015 | Bohn | ................... | G06F 1/1641 |
| 9,228,383 B2* | 1/2016 | Svatos | ...................... | E05D 1/02 |
| 9,348,362 B2* | 5/2016 | Ko | ........................ | G06F 1/1626 |
| 10,073,496 B2* | 9/2018 | Chen | ....................... | F16C 11/04 |
| 10,104,787 B2* | 10/2018 | Rothkopf | ........... | H04M 1/0216 |
| 10,178,765 B2* | 1/2019 | Fan | ....................... | G06F 1/1652 |
| 10,234,905 B2* | 3/2019 | Chen | ................... | H04M 1/0216 |
| 10,234,907 B2* | 3/2019 | Knoppert | .............. | G06F 1/1681 |
| 10,448,527 B2* | 10/2019 | Lin | ........................... | E05D 3/18 |
| 10,459,482 B2* | 10/2019 | McDermid | ........... | G06F 1/1616 |
| 2010/0189497 A1* | 7/2010 | Hughes, Sr. | ............ | E01F 9/629 |
| | | | | 404/12 |
| 2010/0232100 A1* | 9/2010 | Fukuma | .................. | F16G 13/18 |
| | | | | 361/679.01 |
| 2014/0123436 A1* | 5/2014 | Griffin | ................ | H04M 1/0216 |
| | | | | 16/221 |
| 2014/0196254 A1* | 7/2014 | Song | ......................... | E05D 3/14 |
| | | | | 16/302 |
| 2015/0055287 A1* | 2/2015 | Seo | ....................... | G06F 1/1652 |
| | | | | 361/679.27 |
| 2015/0361696 A1* | 12/2015 | Tazbaz | .................. | H04M 1/022 |
| | | | | 361/679.27 |
| 2016/0116944 A1 | 4/2016 | Lee et al. | | |
| 2016/0147267 A1* | 5/2016 | Campbell | ................. | E05D 3/06 |
| | | | | 361/679.27 |
| 2016/0202736 A1* | 7/2016 | Huang | .................. | G06F 1/1681 |
| | | | | 16/369 |
| 2018/0136696 A1 | 5/2018 | Chen et al. | | |
| 2018/0291949 A1* | 10/2018 | Le | .......................... | F16C 11/12 |
| 2018/0307338 A1* | 10/2018 | Park | ...................... | G06F 1/1643 |
| 2018/0313399 A1* | 11/2018 | Nakamura | ............... | F16C 11/04 |
| 2019/0018459 A1* | 1/2019 | Hong | .................... | G06F 1/1681 |
| 2019/0075196 A1* | 3/2019 | Mok | ...................... | G06F 1/1652 |
| 2019/0132432 A1* | 5/2019 | Park | ...................... | H04M 1/0216 |
| 2019/0280226 A1* | 9/2019 | Myeong | ................. | G06F 1/1616 |
| 2019/0289732 A1* | 9/2019 | Sreetharan | ................ | E05D 1/02 |
| 2019/0345748 A1* | 11/2019 | Liao | ...................... | G06F 1/1681 |
| 2019/0346889 A1* | 11/2019 | Chen | ...................... | G06F 1/1656 |

FOREIGN PATENT DOCUMENTS

| | | |
|---|---|---|
| KR | 20130073331 A | 7/2013 |
| KR | 20150082918 A | 7/2015 |
| KR | 20150135731 A | 12/2015 |
| WO | WO-0233685 A1 | 4/2002 |
| WO | WO-2016178659 | 10/2016 |

* cited by examiner

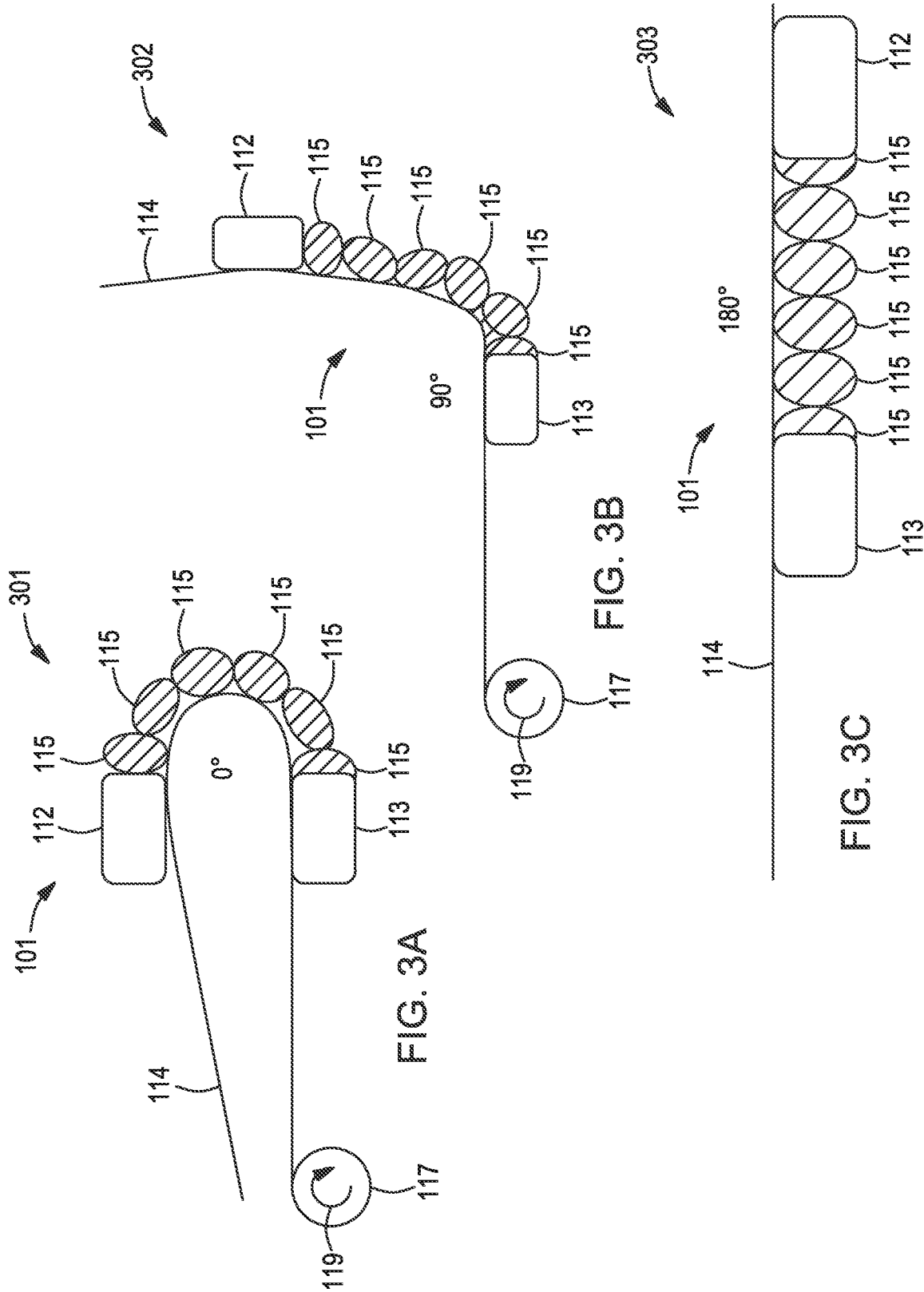

FLEXIBLE STRUCTURES

BACKGROUND

Portable electronic devices can include corresponding housings that contain, protect, and provide for physical form factors that can enhance the utility and purpose of the device. For instance, some housings allow for an integrated monitor or other display device to be positioned for easy viewing in multiple scenarios (e.g., at a desk, on a lap, or in an aircraft) or provide holding surfaces that make it convenient to use the device while standing or in scenarios where it is not possible to set the device down during use. Some portable electronic device housings include multiple parts that offer different configurations during use and to protect various parts, such as touchpads and touchscreens, from damage while being stored or transported.

BRIEF DESCRIPTION OF THE DRAWINGS

FIG. 3A depicts a detailed representation of an example flexible structure in the closed position.

FIG. 3B depicts a detailed representation of the example flexible structure in a partially open position.

FIG. 3C depicts a detailed representation of the example flexible structure in a flat and open position.

DETAILED DESCRIPTION

Implementations of the present disclosure include various configurations of multiple body electronic device housings that are coupled to one another using various example flexible structures. Such flexible structures include multiple flexible connection elements that have various oblong and circular cross sectional profiles. Each of the flexible connection elements in a series can be coupled to one another in a flexible configurations so that the orientation of their cross-sectional axes can rotate relative to one another to expand and contract the length of the series of connection elements. This allows the length of the series of flexible connection elements to lengthen or shorten as needed when the various housing elements are moved relative to one another.

In some example implementations, the flexible connection elements are placed under tension by a flexible strap that can be coupled to the various housing bodies and any of the flexible connection elements. The flexible strap can be tensioned by a spring element disposed in one of the housing bodies. In some implementations, the spring element can include a constant force spring.

An electronic device that includes an electronic housing according to various implementations of the present disclosure can be manipulated to be arranged in any configuration from completely closed to wide open or inverted. The tension provided by the flexible strap or tensioned pivot points between the flexible connection elements allow the housing bodies to maintain a particular orientation relative to one another. Various capabilities and advantages are described below in reference to several example implementations depicted in the accompanying figures. The examples described herein are intended to be illustrative only and are not meant to limit the scope of the present disclosure.

Figure 1A:
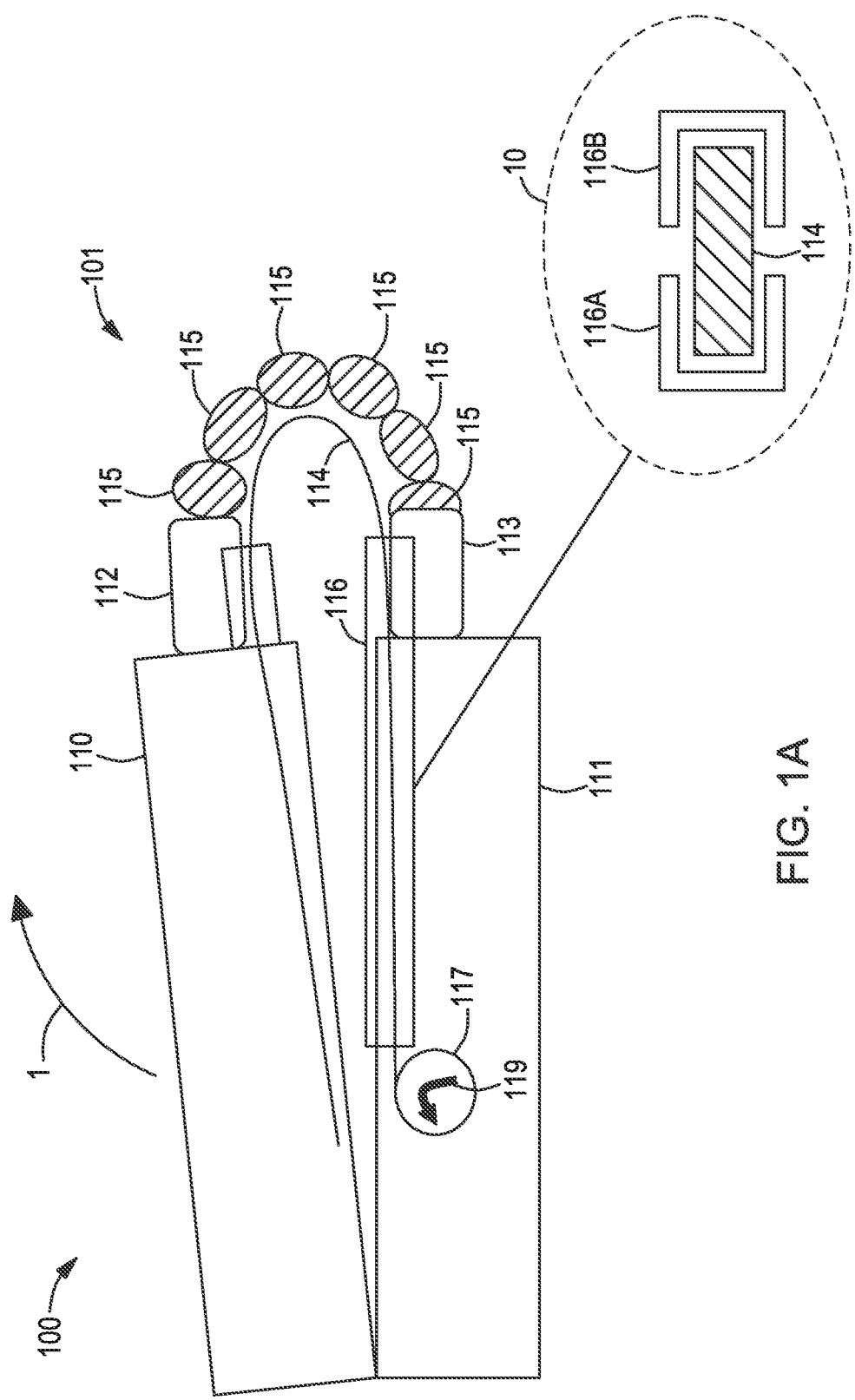
FIG. 1A depicts a schematic representation of an example electronic device with a flexible structure in a closed position.

FIG. 1A depicts a cross-sectional view of an example electronic device housing that includes a flexible structure having a series of oblong connection elements that provide for movement between the component housing elements. In the specific example shown in FIG. 1, the example electronic device housing 100 includes a first or main housing, body 111 and a second or companion housing body 110. The main, housing body 111 and the companion housing body 110 can be coupled to one another by the flexible structure 101. As illustrated, the flexible structure 101 can include various flexible connection elements for coupling the main housing body 111 to the companion housing body 110. The flexible connection elements can have any oblong, oval, or circular cross sectional profile.

The flexible structure 101 can include multiple oblong connection elements 115 coupled to one another in series. The series of oblong connection elements 115 can then be coupled to a first anchor element 113 that connects the series of oblong connection elements to the main housing body 111 and a second anchor element 112 that connects the series of oblong connection elements to the companion housing body 110. As such, both the first anchor element 113 and the second anchor element 112 can include coupling elements for connecting to the oblong connection elements 115 on the respective ends of the series and coupling elements for connecting to the main housing body 111 and the companion housing body 110. For example, the coupling elements of the anchor elements 113 and 112 can include couplers such as, fasteners, clips, screws, rivets, adhesive, welded joints, and the like.

The series of flexible oblong connection elements 115 provide for flexible arrangement of and movement between the main body housing 111 and the companion housing body 110 in the direction indicated by arrow 1. As such, the companion housing body 110 can move, in the particular example shown in FIG. 1A, in an arc relative to the main body housing 111. As the companion body housing 110 moves relative to the main body housing 111, or in instances in which the flexible structure 101 is yet to be coupled to either housing, the orientation of the axes of the oblong connection elements 115 can change relative to one another to increase or decrease the overall length of the series of oblong connection elements 115 (e.g., the oblong connection elements can rotate relative to one another).

For example, in the configuration shown in FIG. 1A, the oblong connection elements 115 are substantially arranged such to be in contact with one another at points proximate to the ends of corresponding cross sectional long axes. In such configurations, the series of oblong connection elements can be longer than the series of oblong connection elements is when the oblong connection elements are in contact with one another at points proximate to the end of corresponding cross sectional short axes.

The main housing body 111 can also include components for supplying tension to the series of oblong connection elements 115. In the example shown in FIG. 1A, the main housing body 111 can include a retractable flexible strap 114 that can be wound around a reel 117 coupled to a spring element 119. The flexible strap 114 can be guided from the spring element 119 through a guide element 116, as shown in the cross sectional detailed view 10. In the specific example shown, the guide element 116 can include two channelized guide elements 116A and 116B having channels disposed toward one another to create a channel in which the flexible strap 114 can movably slide.

The guide element 116 can be disposed in or on the main housing body 111 to allow the flexible strap 114 to enter and exit the main body housing 111 as needed to facilitate movement of the companion housing body 110 and the series of oblong connection elements 115. In some implementations, the guide element 116 can include a low friction lining to allow the fixable strap to move freely as it is wound and unwound about the reel 117.

The flexible strap 114 can also be coupled to any or all of the oblong connection elements 115 in the flexible structure 101. Similarly the flexible strap 114 can also be coupled to the companion housing body 110. In such implementations, the tension provided by the spring element 119, such as a constant force spring, can provide tension along the string of elements that can include the main housing body 111, the flexible structure 101, and the companion housing body 110 to allow the two housing bodies to be arranged in and hold various configurations relative to one another.

Figure 1B:
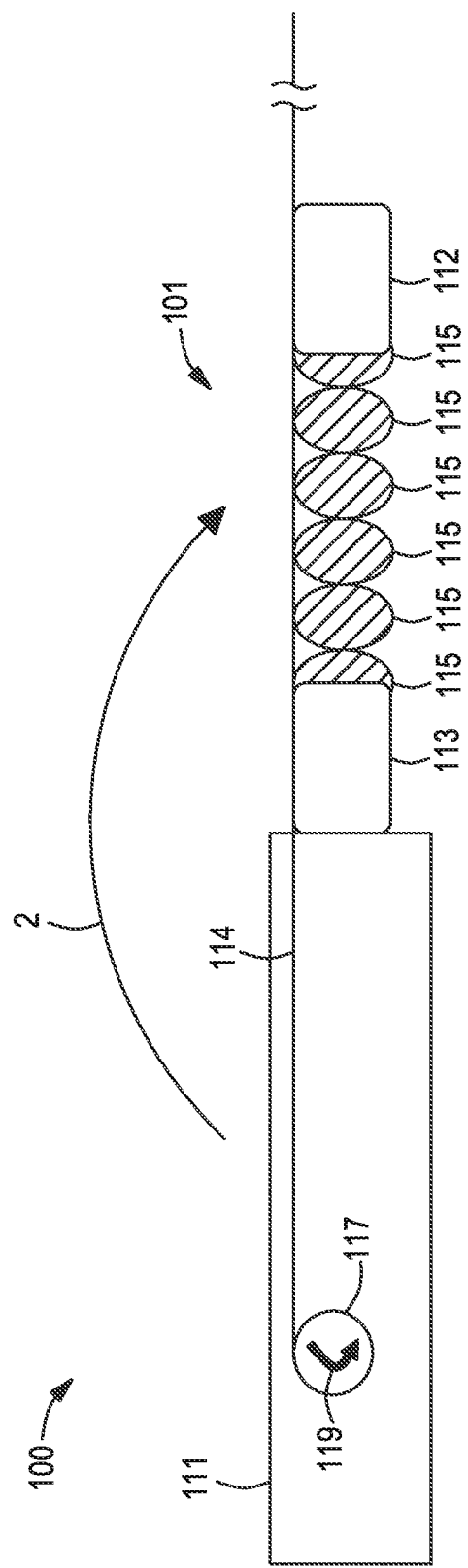
FIG. 1B depicts a schematic representation of the example electronic device with a flexible structure in a partially open position.
Figure 1C:
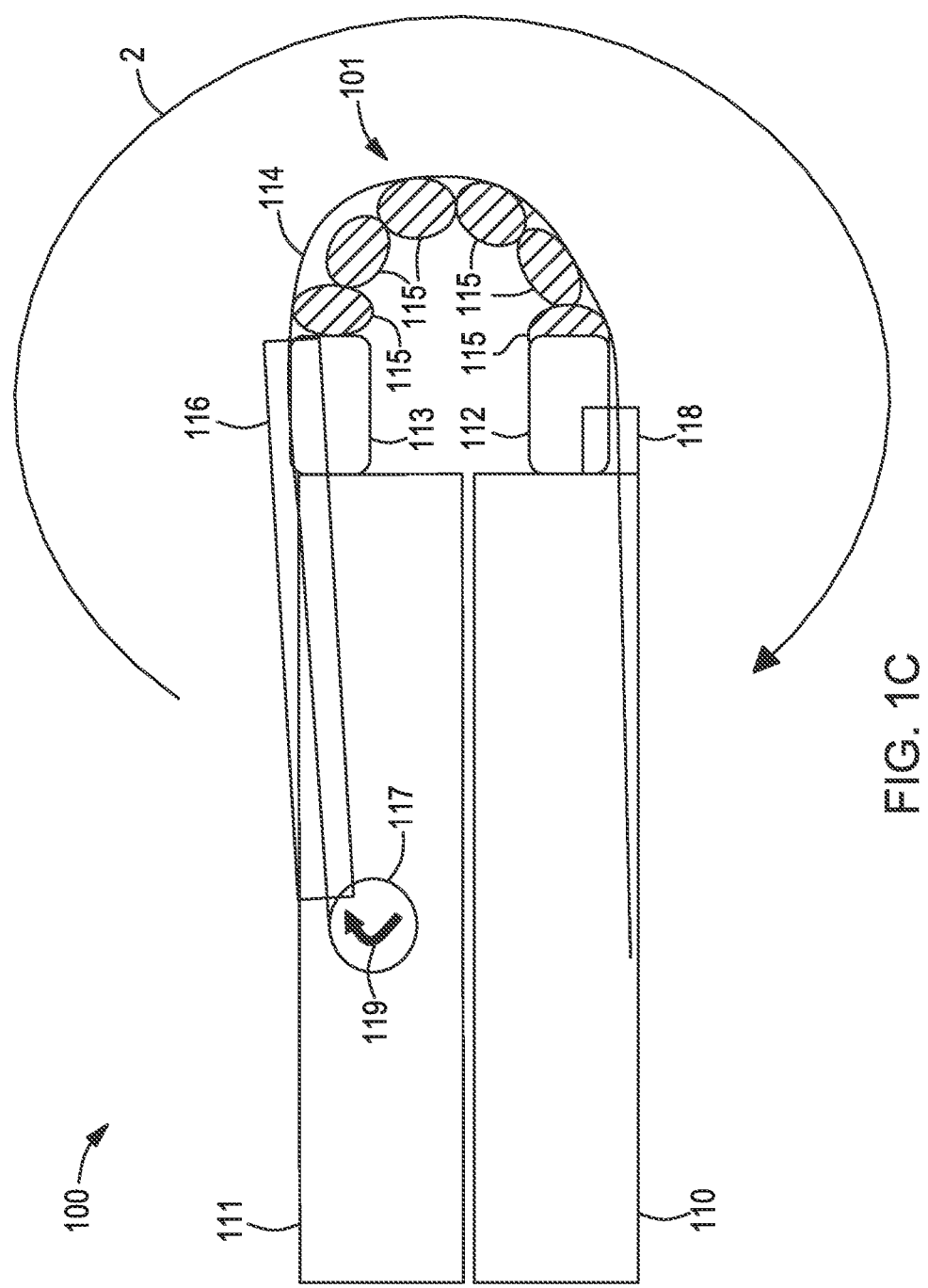
FIG. 1C depicts a schematic representation of the example electronic device with a flexible structure in a fully open position.

FIG. 1B depicts one example configuration of the main body housing 111 and the flexible structure 101 as it is unfolded from the configuration depicted in FIG. 1A in the direction of arrows 1 and 2. The configuration depicted in FIG. 1B can be referred to as an open flat position. In the open flat position, the flexible strap 114 can be pulled back into the main body housing 111 by the spring element in the reel 117. The tension provided by the spring element 119 on of the flexible strap 114 can pull the oblong connection elements 115 into a shortened configuration in which the oblong connection elements 115 are in contact with one another at a point proximate to an end of the cross sectional short axes. As the companion housing body 110 is further moved in an arc of the direction of the arrow 2, the companion housing body 110 can be disposed relative to the main housing body 111, as depicted in FIG. 1C. The configuration depicted in FIG. 1C can be referred to as a wide open configuration as compared to the closed shut configuration depicted in FIG. 1A.

To further illustrate example capabilities of the flexible strap 114 and the flexible structure 101, consider the example in which the main housing body 111 comprises user interface devices (e.g., keyboard, touchpad, pointer stick, etc.), a central processing unit, a motherboard, memory, network cards, and the like, and other components that can often be found in a laptop computer, and the companion housing body 110 comprises a display (e.g., a touchscreen, LCD display, an LED display, etc.), and other components.

In the configuration depicted in FIG. 1A, the first side of the main housing body 111 that includes components such as the user interface devices can be disposed proximate to the side of the companion housing body that includes the display side of a touchscreen. As the companion housing body 110 is moved along arrows 1 and 2 relative to the main body housing 111, the surface of the main housing body 111 and the surface of the companion housing body 110 that used to be proximate to one another are now facing the same direction in the open flat position. The companion housing body 110 can be moved further in the arc indicated by the direction of arrow 2 so that the surfaces of the main body housing 111 and the companion housing body 110 that were outward facing on the exterior of the configuration shown in FIG. 1A, are now disposed proximate to one another in the wide open position, as shown in FIG. 1C. In the wide open position of FIG. 1C, the first side of the main body housing 111 (e.g., the keyboard) is facing outward as is the surface of the companion housing body 110 (e.g., the display surface).

As the companion housing body 110 is moved relative to the main body housing 111, the configuration and relative rotation of the oblong connection elements 115 can change to shorten or lengthen the series of oblong connection elements 115 in the flexible structure 101.

Figure 2:
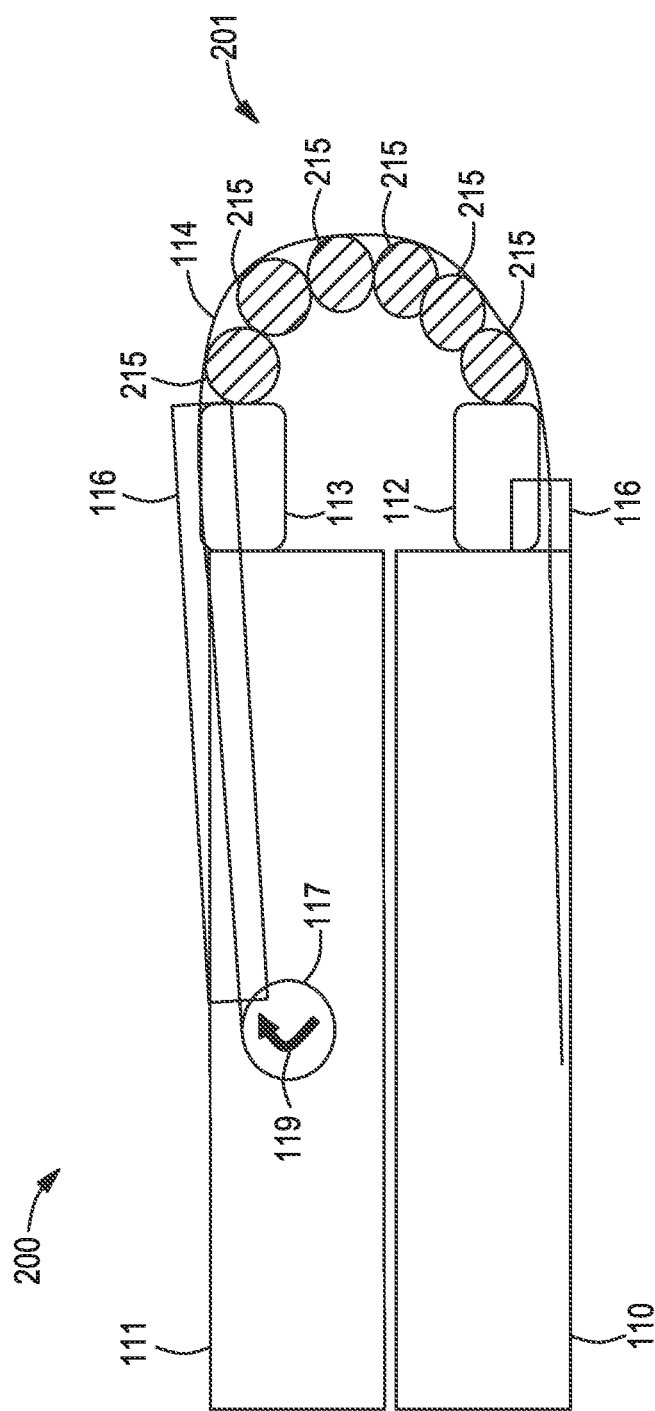
FIG. 2 depicts a schematic representation of another example electronic device with a flexible structure.

In some implementations, the flexible strap 114 can be used with other cross sectional profile type connection elements. FIG. 2 depicts one example implementation in which the electronic device housing 200, in the wide open position, includes components similar to those depicted in the FIGS. 1A through 1C, but includes a flexible structure 201 having flexible connection elements 215 with circular cross sectional profiles. In such implementations, the length of the flexible structure 201 remains substantially constant regardless of the configuration of the electronic device housing 200. For example, the length of the flexible structure 201 is the same in the closed shut, open flat, and wide open configurations. The flexible strap still provides the tension across the series of flexible connection elements 215 by the force applied to it by the spring element 119 and the reel 117.

FIGS. 3A through 3C depict a detailed views of the flexible structure 101 in the closed shut position 301, a semi open position 302, and the open flat position 303, respectively. The series of configurations depict how the cross sectional axes of the oblong connection elements 115 can rotate relative to one another as the flexible structure 101 moves from one configuration to another. Specifically, in the closed shut position 301, the oblong connection elements 115 are disposed such that the cross-sectional long axes are proximate to one another. As the flexible structure 101 moves into the semi open position 301, the cross-sectional axes of the oblong connection elements 115 begin to rotate relative to one another until finally they are in contact with one another at a point proximate to the ends of the short cross-sectional axes in the wide open position 303.

Figure 4A:
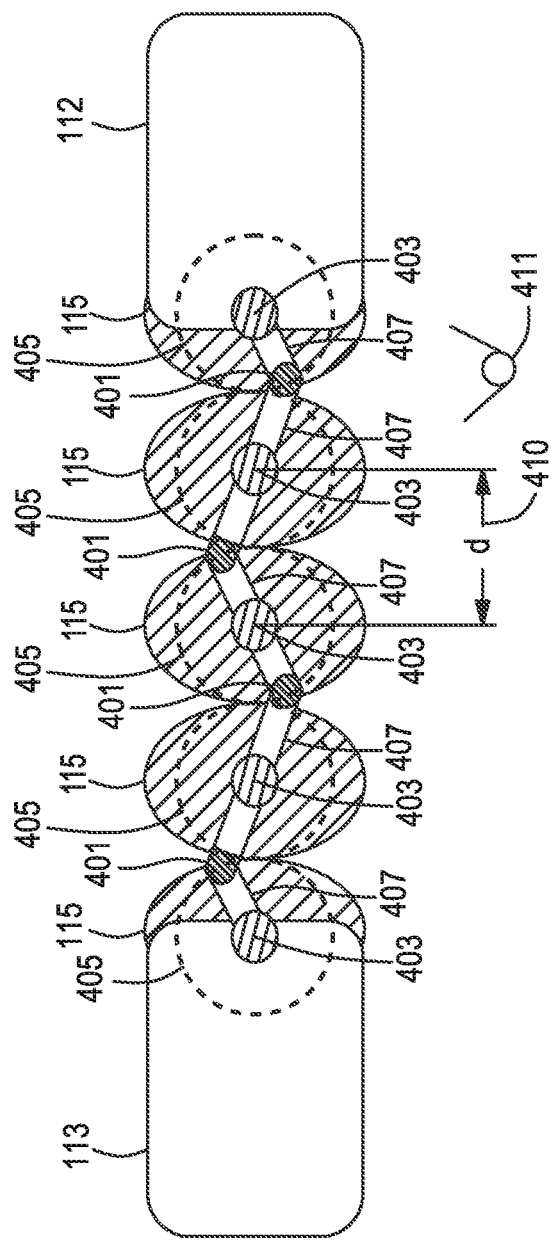
FIG. 4A depicts a detailed view of an example flexible structure with oblong connection elements in a contracted position.
Figure 4B:
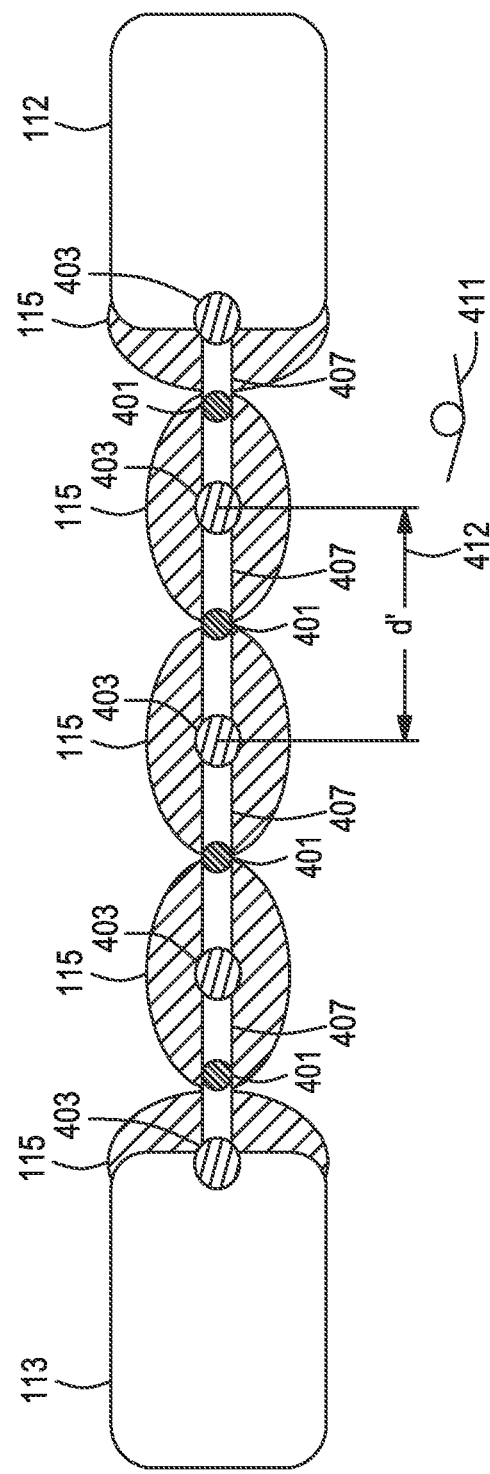
FIG. 4B depicts a detailed view of the example flexible structure with oblong connection elements in an expanded position.

FIGS. 4A and 4B depict detailed views of the couplings between the oblong connection elements 115. As shown, each of the oblong connection elements 115 can include multiple pivot points 401 and connection elements 407. In FIG. 4A, the oblong connection elements 115 are depicted as being in the contracted position in which the contact points between the oblong connection elements 115 are proximate to the ends of the cross sectional short axes. In this configuration, the connection elements 407 rotate about the central pivot points 403 in an accordion or zigzag configuration flexing at the connection points 401 by the force in the torque arcs indicated by the dashed lines 405.

In some implementations, the pivot points 401 can include a spring activated element 411 to provide a tension to pull the oblong connection elements 115 to the low potential energy state depicted in FIG. 4A. Low potential energy state depicted in FIG. 4A can be described as the configuration in which the central pivot points 403 are displaced from one another by the shortest distance, d, possible. However, when the oblong connection elements are stretched apart from one another, as depicted in FIG. 4B, with the cross-sectional long axes in alignment, the spring activated elements 411 connection points 401 are stretched into a higher potential energy state. The high potential energy state depicted in FIG. 4B can be described as a configuration in which the central pivot points are displaced from one another by the largest distance, d', 412.

These and other variations, modifications, additions, and improvements may fall within the scope of the appended claims(s). As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. All of the features disclosed in this specification (including any accompanying claims, abstract and drawings), and/or all of the elements of any method or process so disclosed, may be combined in any combination, except combinations where at least some of such features and/or elements are mutually exclusive.

What is claimed is:

1. A flexible structure comprising:
a plurality of oblong connection elements flexibly coupled to one another in series and having a first end oblong connection element and a second end oblong connection element;
a first anchor element coupled to the first end oblong connection element;
a second anchor element coupled to the second end oblong connection element; and
a flexible strap, windable around a reel coupled to a spring element, to provide tension from the spring element to the plurality of oblong connection elements, wherein the tension provided by the flexible strap biases consecutive oblong connection elements of the plurality of oblong connection elements toward a position in which the consecutive oblong connection elements are in contact with one another at a point proximate to ends of their respective short cross-section axes.

2. The flexible structure of claim 1 the flexible strap is retractable within a housing body, housing the reel, by winding the flexible strap around the reel.

3. The flexible structure of claim 1 wherein the spring element comprises a constant force spring.

4. The flexible structure of claim 2 wherein the tension causes each of the plurality of oblong connection elements to rotate about corresponding longitudinal axes toward a corresponding lowest potential resting position.

5. The flexible structure of claim 1 further comprising a guide element disposed around the flexible strap so that the flexible strap is movably captured in an interior region of the guide element, and wherein a first region of the flexible strap is coupled to the first anchor element by the guide element.

6. The flexible structure of claim 1 wherein the first anchor element comprises connector elements to couple the first end oblong connection element to a body.

7. The flexible structure of claim 1 wherein the flexible strap is coupled to an oblong connection element of the plurality of oblong connection elements.

8. An electronic device housing comprising:
a flexible structure comprising a plurality of oblong connection elements flexibly coupled to one another in series and having a first end oblong connection element and a second end oblong connection element, wherein consecutive oblong connection elements are coupled to one another by a rotating joint including a spring element to bias the consecutive oblong connection elements toward a low potential energy state, wherein the low potential energy state corresponds to a position in which a distance between respective central pivot points of the consecutive oblong connection elements is less than a distance between the respective central pivot points of the consecutive oblong connection elements in a high potential energy state;
a first housing body coupled to the first end oblong connection element; and
a second housing body coupled to the second end oblong connection element.

9. The electronic device housing of claim 8 wherein the first housing body is movable in an arc relative to the second housing body.

10. The electronic device housing of claim 9 wherein the arc is in a range of 0 degrees to 360 degrees.

11. The electronic device housing of claim 8 wherein the rotating joint is a rotating joint among a plurality of rotating joints across the plurality of oblong connection element.

12. The electronic device housing of claim 11 wherein the plurality of rotating joints are oriented in a zigzag configuration when the consecutive oblong connection elements are oriented in the low potential energy state.

13. A flexible coupler comprising:
a first oblong connection element; and
a second oblong connection element coupled to the first oblong connection element by a rotating joint that provides rotational freedom of movement between the first and second oblong connection elements, wherein the rotating joint comprises a spring element to provide tension such that the first and second oblong connection elements are pulled toward a position in which the first and second oblong connection elements are in contact with one another at a point proximate to ends of their respective short cross-section axes.

14. The flexible coupler of claim 13, wherein the tension provided by the spring element of the rotating joint pulls the first and second oblong connection elements out of a position in which the first and second oblong connection elements are in contact with one another at a point proximate to ends of their respective long cross-section axes.

* * * * *